United States Patent
Manetakis et al.

(10) Patent No.: US 7,427,900 B2
(45) Date of Patent: Sep. 23, 2008

(54) INTEGRATED PLL LOOP FILTER AND CHARGE PUMP

(75) Inventors: Konstantinos Manetakis, Caen (FR); Nicolas Constantinidis, Cresserons (FR)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 11/050,131

(22) Filed: Feb. 3, 2005

(65) Prior Publication Data
US 2006/0145770 A1    Jul. 6, 2006

Related U.S. Application Data

(60) Provisional application No. 60/640,488, filed on Dec. 30, 2004.

(51) Int. Cl.
*H03L 7/093* (2006.01)
(52) U.S. Cl. .......................... 331/17; 327/157
(58) Field of Classification Search ................. 327/157; 331/16, 17
See application file for complete search history.

(56) References Cited

U.S. PATENT DOCUMENTS

| | | | |
|---|---|---|---|
| 4,987,387 A * | 1/1991 | Kennedy et al. | ............ 331/1 A |
| 6,111,468 A | 8/2000 | Tanishima | |
| 6,344,772 B1 | 2/2002 | Larsson | |
| 6,711,229 B1 | 3/2004 | Harada | |
| 6,768,359 B2 | 7/2004 | Hsu | |
| 6,774,679 B2 | 8/2004 | Nogami | |
| 7,030,688 B2 * | 4/2006 | Dosho et al. | ................. 327/558 |
| 7,154,345 B2 * | 12/2006 | Moyal et al. | .................. 331/17 |

OTHER PUBLICATIONS

David R. Smith, "5.5 Pulse Shaping and Intersymbol Interference," Digital Transmission Systems, Copyright 1985, pp. 207-210, 562, Van Nostrand Reinhold Company Inc., New York, New York, U.S.A.

* cited by examiner

*Primary Examiner*—Robert J. Pascal
*Assistant Examiner*—James E Goodley
(74) *Attorney, Agent, or Firm*—Howison & Arnott, L.L.P.

(57) ABSTRACT

A charge pumped phase locked loop circuit (PLL) is disclosed that includes a phase detector for detecting the phase error between a reference clock and an output clock to generate a phase error signal. A charge pump is provided that is controlled by the phase error signal to either source current to an intermediate control node or to sink current therefrom. An isolation circuit maintains the intermediate control node at a virtual AC reference voltage such that it remains at substantially the same voltage during the sourcing of current thereto or sinking of current therefrom, the isolation circuit generating a control voltage on the output thereof to control the frequency of the output clock. A loop filter is provided for filtering the control voltage.

14 Claims, 2 Drawing Sheets

INTEGRATED PLL LOOP FILTER AND CHARGE PUMP

TECHNICAL FIELD OF THE INVENTION

The present invention pertains in general to phase lock loops (PLLs) and, more particularly, to the operation of the charge pump and loop filter portion of the PLL.

CROSS-REFERENCE TO RELATED APPLICATIONS

This application is related to U.S. Provisional Patent Application Ser. No. 60/640,488, filed on Dec. 30, 2004 entitled "INTEGRATED PLL LOOP FILTER AND CHARGE PUMP."

BACKGROUND OF THE INVENTION

Phase lock loops utilize a phase detector for comparing the phase of a reference clock with that of an output clock that utilizes a voltage controlled oscillator (VCO) to generate a phase error that varies the control voltage on the input to the VCO. By adjusting this voltage, the phase of the VCO can be locked the phase of the reference clock. Typically, some type of loop filter is disposed between the phase detector and the VCO. In a charge pump PLL, a typical phase detector generates control voltages for controlling a charge pump circuit which is operable to selectively pump charge to a node for increasing a voltage level or pulling charge from the node to provide a decreasing voltage level. To increase the voltage level, charge is sourced from a supply voltage and, to decrease the voltage level, charge is sinked to a ground reference. When the relative phase between the VCO and the reference clock are either lagging or leading, then either the sourcing or sinking of a charge pump is controlled.

This charge pump is typically facilitated with two current sources that are switched to the voltage input to the VCO. When charge is being sourced to the node, the phase of the VCO will change from either a lagging or leading to a leading or lagging phase, such that the phase detector will then cause the charge pump to sink current. When the PLL is locked, the phase error should be substantially at a zero phase error which should result in no current being sourced to or sinked from the voltage control input of the VCO. However, conventional charge pumps are fabricated with two transistor switches, one for sourcing current and one for sinking current, that are switched to either a conducting state or a non-conducting state. However, the current source is a function of the voltage on the VCO input. As the voltage changes, the characteristics of the switch and the associated current source will also change. Therefore, if the voltage changes, i.e., it is not constant, there is a possibility that the currents will not be balanced. If they are not balanced, then a phase error can result at phase lock, which could cause jitter in the clock. Thus, it is desirable that the currents are balanced for all possible voltages input to the VCO over the entire range required during the operation thereof.

SUMMARY OF THE INVENTION

The present invention disclosed and claimed herein, in one aspect thereof, comprises a charge pumped phase locked loop circuit (PLL). The PLL includes a phase detector for detecting the phase error between a reference clock and an output clock to generate a phase error signal. A charge pump is provided that is controlled by the phase error signal to either source current to an intermediate control node or to sink current therefrom. An isolation circuit maintains the intermediate control node at a virtual AC reference voltage such that it remains at substantially the same voltage during the sourcing of current thereto or sinking of current therefrom, the isolation circuit generating a control voltage on the output thereof to control the frequency of the output clock. A loop filter is provided for filtering said control voltage.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
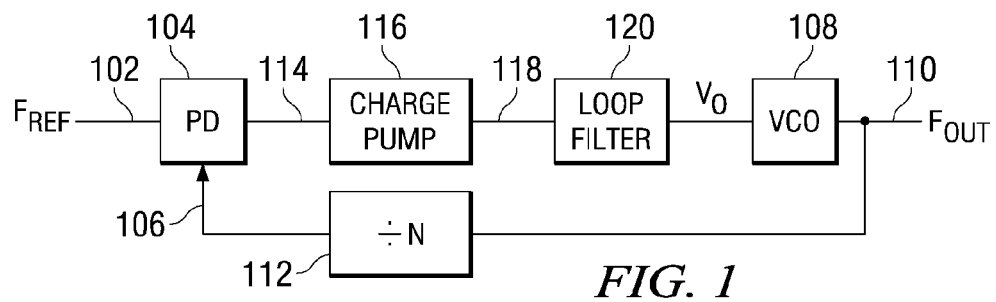
FIG. 1 illustrates a prior art phase lock loop utilizing a charge pump.

Referring now to the drawings, and more particularly to FIG. 1, there is illustrated a diagram of a prior art phase lock loop. The phase lock loop receives a reference frequency on a frequency input 102 that is input to a phase detector 104. The phase detector 104 is operable to compare the phase of the reference clock on input 102 with a variable clock frequency associated with an output clock on an input 106. This variable frequency on the input 106 is generated by a voltage controlled oscillator (VCO) 108 that is operable to generate a frequency $F_{OUT}$ on an output 110. This can be at a frequency that is greater than the frequency of the reference clock on the input 102. If so, the output of the VCO 108 on output 110 is divided by a divide block 112 to provide a divided down clock frequency at substantially the frequency of the reference clock, on the line 106.

The phase detector 104 is operable to generate a phase error on a line 114. This phase error provides a control signal for a charge pump 116. The charge pump 116 is operable to either increase the charge on a node 118 or decrease the charge thereon, such that the voltage thereon will be controlled as a function of the output of the phase detector 104. This is filtered by a loop filter 120 to provide a voltage $V_O$ for input to the VCO 108. This voltage $V_O$ provides a control voltage to control the frequency of the VCO 108. This is a conventional operation.

Figure 2:
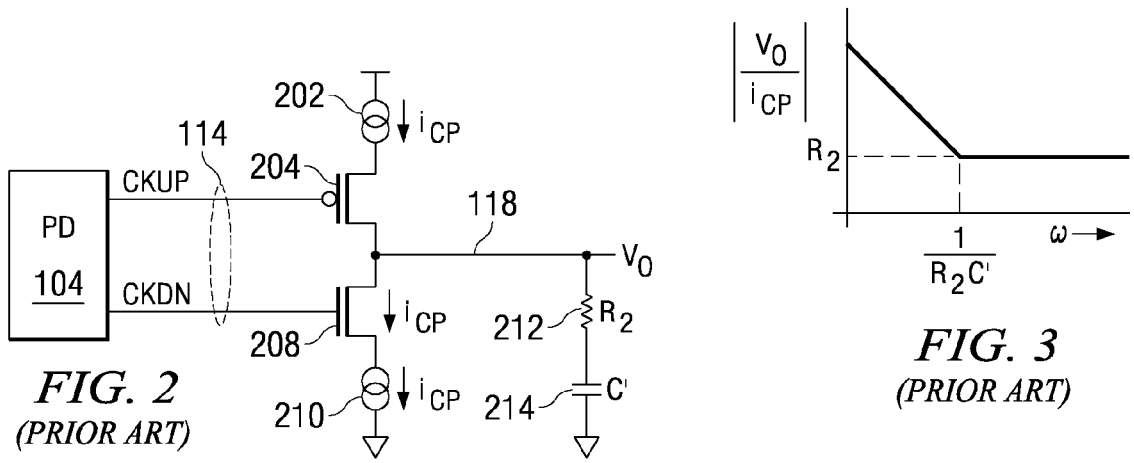
FIG. 2 illustrates a schematic diagram of a prior art charge pump and loop filter.

Referring now to FIG. 2, there is illustrated a schematic diagram of the prior art charge pump 116 and the loop filter 120. The charge pump is comprised of a current source 202 that is operable to source current through the source/drain path of a p-channel transistor 204 to the node 118. The gate of transistor 204 is connected to a clock signal, CKUP, output by the phase detector 104. Current is sinked from the node 118 through the source/drain path of a transistor 208 through a current source 210 to ground. The gate of transistor 208 is connected to a clock signal, CKDN, output by the phase detector 104. The gates of transistors 204 and 208 comprise the phase error output of the phase detector 104 on line 114.

The loop filter 120 is comprised of a resistor 212 connected between node 118 and one plate of a capacitor 214. The other plate of capacitor 214 is connected to ground. Resistor 212 has a value of $R_2$ and capacitor C has a value of C'. The voltage $V_O$ is defined as follows:

$$V_O = i_{cp}\left(R_2 + \frac{1}{sC'}\right)$$

where: $s=j\omega$

This results in the following relationship:

$$\frac{V_O}{i_{cp}} = R_2 + \frac{1}{sC'}$$

Figure 3:
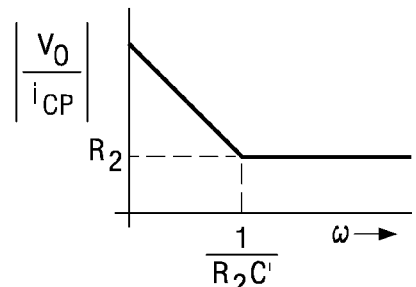
FIG. 3 illustrates a prior art wave form for the operation of the charge pump and loop filter.

The absolute value of $V_O/i_{cp}$ has a frequency response as set forth in the plot of FIG. 3, this being a prior art plot. It can be seen that the absolute value of $V_O/i_{cp}$ represents impedance versus frequency and this decreases until the value thereof is equal to $R_2$ at a frequency of $1/R_2C'$, at which time the response is relatively flat.

Figure 4:
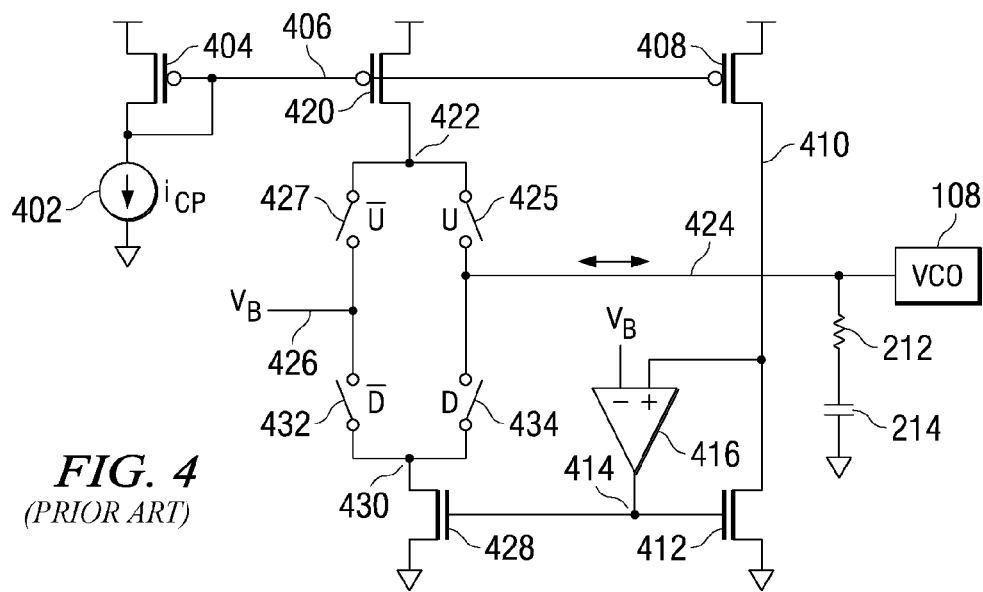
FIG. 4 illustrates a schematic diagram of the charge pump circuit of the present disclosure and the interface thereof with the VCO.

Referring now to FIG. 4, there is illustrated a schematic diagram of a prior art charge pump circuit. A current source 402 is provided that generates the charge pump current, $i_{cp}$. This current source 402 will be mirrored over to the rest of the circuit. One side of the current source 402 is connected to ground and the other side thereof connected to one side of the source/drain path of the p-channel transistor 404, the other side thereof connected to $V_{DD}$. The gate of transistor 404 is connected to a node 406 and to the drain thereof at the current source 402. Node 406 is also connected to the gate of a p-channel transistor 408, the source/drain thereof connected between $V_{DD}$ and a node 410. Node 410 is connected to one side of the source/drain path of an n-channel transistor 412, the other side thereof connected to ground. The gate of transistor 412 is connected to a node 414. An isolating amplifier 416 drives the gate 414 from the drain thereof. The positive input of the amplifier 416 is connected to the node 410 and the negative input thereof is connected to a bias voltage $V_B$. This is for the purpose of matching, which will be described herein below. In general, the amplifier 416 isolates the drain and gate, such that the gate voltage $V_{GS}$ does not affect the drain voltage, $V_{DS}$, thereof, since this is a diode-connected transistor configuration.

The node 406 is also connected to the gate of a p-channel transistor 420, the source/drain path thereof connected between $V_{DD}$ and a node 422. Node 422 is a switched node which is switched between an output node 424 and a bias node 426 with switches 425 and 427, respectively. It is switched between an output node 424 and a bias node 426. Node 426 is connected to a bias voltage $V_B$, which could be the same bias voltage disposed on the negative input of the amplifier 416, or a different bias voltage. The node 414 is connected to the gate of an n-channel transistor 428, the source/drain thereof connected between ground and a node 430. Node 430 is switched between node 426 and node 424 with switches 432 and 434, respectively.

The switch 425 is controlled by a clock signal U and switch 427 is controlled by a clock signal U-Bar. Switch 434 is controlled by a clock signal D and switch 432 is controlled by the inverse thereof, a clock signal D-Bar.

In operation, the current through transistor 404 is mirrored over to the mirror leg comprised of transistors 408 and 412. This controls the bias on the transistor 428, such that the current through transistor 420 will be $i_{cp}$ and the current through transistor 428 will be $i_{cp}$, since the current through transistor 408 is $i_{cp}$ and the current through transistor 412 is $i_{cp}$. If switch 425 is closed, connecting node 422 to node 424, then current will be sourced by transistor 420 to node 424. This current will be $i_{cp}$. However, if the node 430 is disconnected from node 424 and is left floating, then no current will flow through transistor 428 until it is connected. Once connected by switch 434 (with switch 425 open), then current will be sinked from node 424. However, if transistor 420 is completely off prior to switch 434 turning on, this will require the capacitance on node 430 to be charged up. To prevent the situation, switch 432 will be connected to node 426 when switch 434 is open and switch 425 is closed. In this manner, current will flow through transistor 424, maintaining a current of $i_{cp}$. Thus, when switch 425 opens and switch 434 closes, and switch 432 opens, then the $V_{DS}$ of the transistor will not have to charge up and, therefore, will not affect the voltage on node 424 due to the change in state of transistor 428. Therefore, when either of the switches 425 or 434 are open, the complimentary side thereof, switch 427 or 432, will be connected to the bias voltage 426, such that current flows there through. In the prior art embodiment of FIG. 4, the node 424 is connected directly to the $V_O$ control input to the VCO 108, and the voltage on the node 424 is therefore not known and will vary. The loop filter comprised of the capacitor 214 and resistor 212 is attached to the node 424.

Figure 4A:
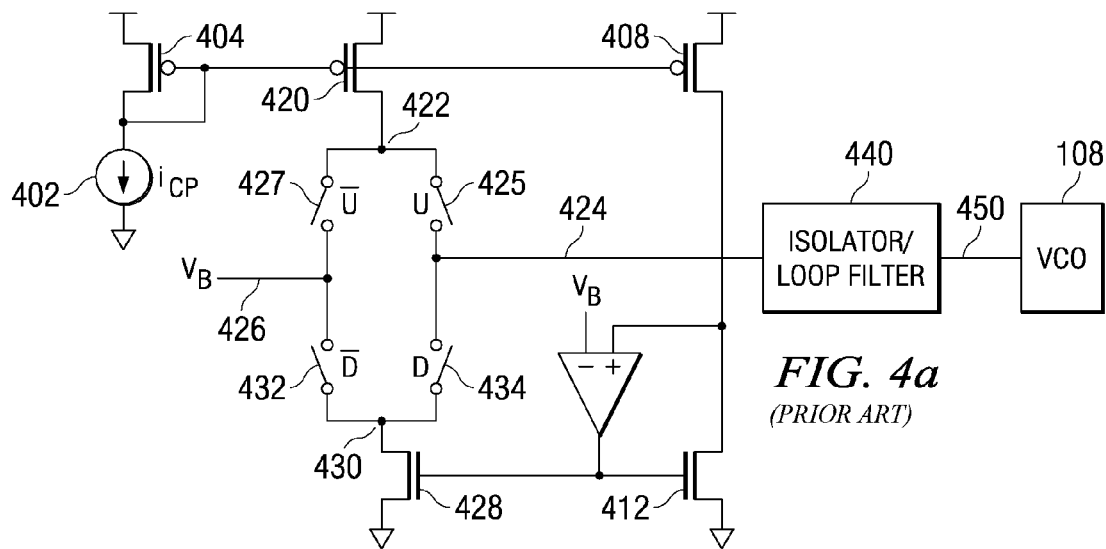
FIG. 4a illustrates a schematic diagram of an alternate embodiment of a prior art charge pump and loop filter.

Referring now to FIG. 4a, there is illustrated the charge pump circuit of the present disclosure, which includes an isolator/loop filter 440 disposed between the node 424 and a control node 450 that provides the control voltage $V_O$ as the input to the VCO 108.

With the isolator 440 in the embodiment of FIG. 4a, the operation of the transistors 420 and 428 is such that the characteristics thereof for providing balanced current allow the voltage on node 424 to be a known voltage. This voltage, regardless of the current, is a virtual AC ground as a direct function of the isolator/loop filter 440. Therefore, the voltage $V_{DS}$ across transistor 420 and the voltage $V_{DS}$ across transistor 428 remain constant for all phase errors by forcing the voltage on node 424 for any given voltage $V_O$ to be the same, i.e., it is set at a virtual ground, the ground being a predetermined reference voltage which is not necessarily the same as the ground of the system. It has an AC ground but a DC offset, which is basically set a predetermined bias voltage. Thus, the use of the switches 425, 427, 434 and 432 allow the $V_{DS}$ of transistors 420 and 428 to remain unchanged regardless of whether they are connected to node 424 or to node 426 and the use of the isolator/loop filter 450 allows the voltage on node 424 to remain at a constant virtual AC ground. The amplifier 416 is provided for allowing the current through transistor 428 and the current through transistor 420 to be balanced such that they are substantially identical to each other.

Figure 5:
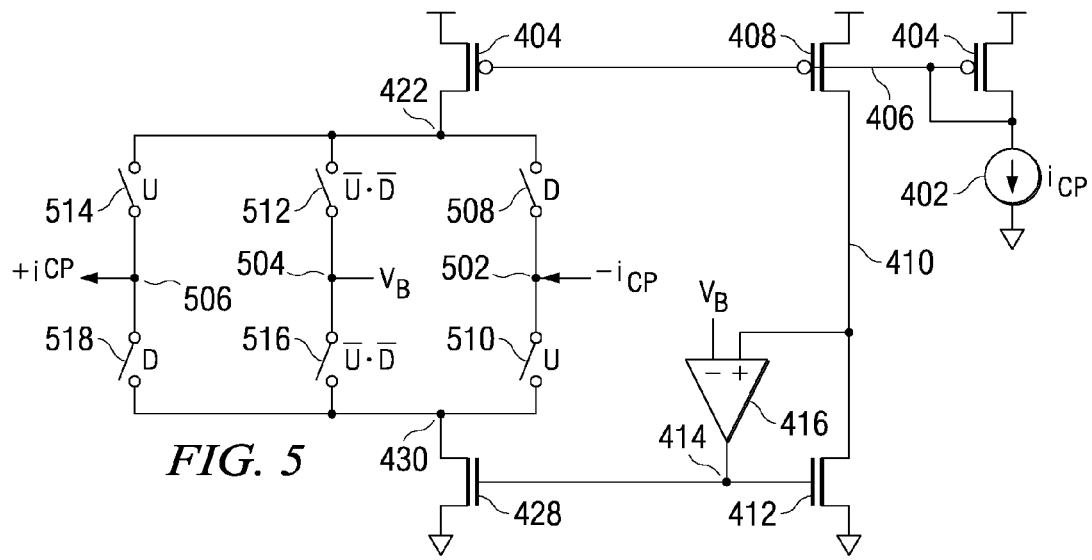
FIG. 5 illustrates a schematic diagram of an alternate embodiment of the charge pump.

Referring now to FIG. 5, there is illustrated a schematic diagram of an alternate embodiment of the charge pump of FIG. 4, wherein like numerals refer to like parts in the two figures. In this embodiment, a different switch structure is disposed between nodes 422 and 430 to provide a push/pull current. The node 422 is switched between three nodes, a negative current node 502, a bias node 504 connected to bias voltage $V_B$ and a positive current node 506. Node 422 is connected through a switch 508 to node 502 and node 430 is connected to a switch 510 to node 502. Node 422 is connected to bias node 504 through a switch 512 and to the positive current node 506 through a switch 514. Node 430 is connected to the bias node 504 through a switch 516 and to the positive current node 506 through a switch 518. Switch 508 and switch 518 are controlled by the clock signal D (representing a sink operation). Switch 514 and switch 510 are controlled by the clock signal U (representing a sourcing operation). Nodes 512 and 516 are controlled by the AND operation between the clock signals U-Bar and D-Bar. Therefore, whenever the sink clock signal "U" is active, the positive node 506 is connected to node 430 and the negative current node 502 is connected to node 432. Whenever the up clock, U, is active, node 502, the negative current node, is connected to node 430 and the positive current node 506 is connected to node 422 through switch 514. Whenever either of the clock signal D or the clock signal U is absent, such as when there occurs a situation between clock signals that results in a gap where neither of the clock signals U or D is high, this will result in a dead time where no current is being sourced to or sinked from the output node. This would represent a "lock" condition. In this condition, it is important that the transistors 404 and 428 not be turned off and that current continually flows there through such that the voltage $V_{DS}$ there across is maintained. Thus, when current is required to be sourced to or sinked from the output node, the appropriate switches can be connected without having to increase $V_{DS}$ from zero to the required voltage level.

Figure 6:
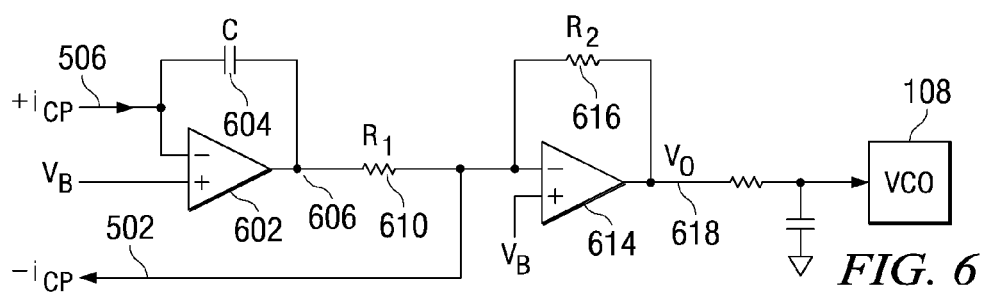
FIG. 6 illustrates a logic diagram of the loop filter that interfaces with the charge pump of FIG. 5.

Referring now to FIG. 6, there is illustrated a logic diagram for the loop filter that is utilized to realize the isolator/loop filter 430 of FIG. 4. As noted herein above, this requires both the loop filter operation and the virtual AC ground at the input thereof, while generating the VCO control voltage $V_O$ on line 432. This loop filter operates in conjunction with the charge pump of FIG. 5. The node 506, the positive current node, is connected to the negative input of an amplifier 602. The negative input thereof is connected to the output thereof through a capacitor 604 having a value C. The output of amplifier 602 is connected to a node 606. The positive input of amplifier 602 is connected to a bias voltage $V_B$. Node 606 is connected to one side of a series resistor 610 labeled $R_1$, the other side thereof connected to node 502, the negative current node. The amplifier 602 and capacitor 604 provide the integrator portion of the filter, wherein the node 506 is a virtual ground which has a DC voltage that is substantially the bias voltage $V_D$ and it is an inverting integrator, such that the voltage at node 606 is $-i_{cp}/sC$.

Node 502 is connected to the negative input of an amplifier 614, the positive input thereof connected to the bias voltage $V_B$. The negative input of the amplifier 614 represents a virtual ground, such that the node 502 will always be connected to virtual ground. The nodes 502 and 506 are intermediated control voltage nodes. The negative input of the amplifier 614 is connected through a series resistor 616, labeled $R_2$, to the output thereof on a node 618. Resistor 610 is labeled $R_1$ and resistor 616 is labeled $R_2$. Therefore, the voltage on node 606 will be amplified by amplifier 614, an inverting amplifier, by the following relationship for a voltage component $V_{i+}$:

$$V_{i+} = -\frac{i_{cp}}{sC}\left(-\frac{R_2}{R_1}\right) = \frac{i_{cp}}{sC\frac{R_1}{R_2}}.$$

where $R_1 > R_2$. This will be summed at the output node with the voltage associated with $-i_{cp}$. This will result in the voltage component $V_{i-}$ as follows:

$$V_{i-} = R_2(-i_{cp})$$

The combined voltage $V_O$ on the output node 618 will be $V_{i+} + V_{i-}$ with the following relationship:

$$V_O = i_{CP}\left(R_2 + \frac{1}{sC\frac{R_1}{R_2}}\right)$$

where:

$$\frac{V_O}{i_{cp}} = R_2 + \frac{1}{S \cdot \beta \cdot C}$$

where: $\beta = R_1/R_2$.

It can be seen that the value of $\beta$ represents the capacitance multiplication. As such, for a $\beta$ of "10" the capacitance value can be reduced by a value of "10." This results in a lower required capacitor value and consequently, a lower amount of area on the semiconductor surface that is required to realize such a capacitor.

Although the preferred embodiment has been described in detail, it should be understood that various changes, substitutions and alterations can be made therein without departing from the scope of the invention as defined by the appended claims.

What is claimed is:

1. A charge pumped phase locked loop circuit, comprising:
 a phase detector for detecting the phase error between a reference clock and an output clock to generate a phase error signal;
 a charge pump controlled by said phase error signal to either source current to an intermediate control node or to sink current therefrom;
 an isolation circuit to maintain said intermediate control node at a virtual AC reference voltage such that it remains at substantially the same voltage during the sourcing of current thereto or sinking of current therefrom, said isolation circuit generating a control voltage on the output thereof to control the frequency of said output clock; and
 a loop filter integral with said isolation circuit for filtering said control voltage, said isolation circuit with said integral loop filter including a first stage including an operational amplifier responsive to either the source current or the sinked current from said charge pump and a second stage in series therewith including an operational amplifier responsive to the other of the source current or the sinked current from said charge pump, and said loop filter having an impedance of $$R + \frac{1}{sC}$$

where $s = j\omega$, said loop filter including a capacitor "$C_1$" associated with said first stage and a capacitor multiplier formed by said second stage having a multiplication factor of $\beta$ to multiply the capacitance of capacitor "$C_1$" thereby to provide a relationship for impedance of $$R + \frac{1}{s\beta C_1}$$

such that a smaller physical capacitor can be utilized in said loop filter as a function of β.

2. The circuit of claim 1, wherein said charge pump comprises:
  a first current source for sourcing current to said intermediate control node; and
  a second current source for sinking current from said intermediate control node; and
  said phase detector operable to generate control signals for controlling said first current source to source current to said intermediate control node when said phase error is in one direction and to control said second current source to sink current from said intermediate control node when said phase error is in a second and opposite direction and, when a phase lock condition is present, to neither source current nor sink current to or from said intermediate control node.

3. The circuit of claim 2, wherein said first current source comprises:
  a sourcing current source for sourcing a charge pump current,
  a first primary switch for switching the output of said sourcing current source to said intermediate control node, and
  a first complimentary switch operable to switch the output of said sourcing current source to a bias node biased with a predetermined voltage when said first primary switch is not operable to connect the output of said sourcing current source to said intermediate control node; and
said second current source including:
  a sinking current source for sinking a charge pump current,
  a second primary switch for switching the output of said sinking current source to said intermediate control node, and
  a second complimentary switch operable to switch the output of said sinking current source to a secondary bias node biased with a predetermined voltage when said second primary switch is not operable to connect the output of said sinking current source to said intermediate control node.

4. The circuit of claim 3, wherein said isolation circuit in said first stage includes as said operational amplifier an amplifier having a differential input with said intermediate control node connected to one input thereof and a reference voltage connected to the other input thereof.

5. The circuit of claim 2, wherein said intermediate control node is comprised of two separate nodes, a first intermediate control node and a second intermediate control node and wherein:
  said first current source comprises:
    a sourcing current source for sourcing a charge pump current,
    a first primary switch for connecting the output of said sourcing current source to said first intermediate control node,
    a first complimentary switch for connecting the output of said sourcing current source to said second intermediate control node, and
    a first dead time switch for connecting the output of said sourcing current source to a bias node that is connected to a bias voltage;
  said second current source comprising:
    a sinking current source for sourcing a charge pump current,
    a second primary switch for connecting the output of said sinking current source to said first intermediate control node,
    a second complimentary switch for connecting the output of said sinking current source to said second intermediate control node, and
    a second dead time switch for connecting the output of said sinking current source to the bias node that is connected to the bias voltage;
  said phase detector operable, when said phase error is in said one direction, to source current from said sourcing current source through said first primary switch to said first intermediate control node and sink current through said sinking current source from said second complimentary switch and, when said phase error is in said second and opposite direction, to source current from said sourcing current source to said second intermediate control node through said first complimentary switch and to sink current to said sinking current source through said second primary switch from said first intermediate control node and,
  when a phase lock condition is present, to source current through said first dead time switch from said sourcing current source to said bias node and sink current from said bias node to said sinking current source through said second dead time switch.

6. The circuit of claim 5, wherein said isolation circuit comprises:
  as said first stage, an integrator for integrating the current on said first intermediate control node through a first filter capacitor, comprising capacitor $C_1$, to provide on an output thereof the integrated voltage of the charge pump current, icp, divided by the capacitance term $j\omega C_1$ as an integrated voltage, wherein the input to integrator is disposed at a virtual AC ground;
  a high frequency stabilizing portion as said second stage that stabilizes the high frequency portion of the loop response, such that the capacitance $C_1$ and the high frequency stabilizing portion provide the loop filter function integrated with said isolation circuit and wherein said secondary intermediate control node is connected to virtual AC ground.

7. The circuit of claim 6, wherein:
  said integrator is comprised of:
    a first amplifier as said operational amplifier in said first stage having a negative input and a positive input, said negative input connected to said first intermediate control node and said positive input thereof connected to a bias voltage to provide an AC virtual ground at said negative input,
    said capacitor $C_1$ connected between said negative input of said amplifier and said output of said amplifier with said output providing the voltage icp/$C_1$, and
    a first resistor, R1, connected between the output of said first amplifier and said second intermediate control node;
  said high frequency stabilizing section comprising:
    a second amplifier as said operational amplifier in said second stage having a positive input and a negative input, the negative input thereof connected to said second intermediate control node and the positive input thereof connected to a bias voltage, and a feedback resistor, R2, connected between said negative input and said output of said second amplifier such that the gain thereof is R2/R1, which comprises the "R" portion of the impedance of said loop filter, the output of said second amplifier comprising the output control voltage.

8. A charge pumped phase locked loop circuit, comprising:

a phase detector for detecting the phase error between a reference clock and an output clock to generate a phase error signal;

a charge pump controlled by said phase error signal to either source current to an intermediate control node or to sink current therefrom;

an isolation circuit to maintain said intermediate control node at a virtual AC reference voltage such that it remains at substantially the same voltage during the sourcing of current thereto or sinking of current therefrom, said isolation circuit generating a control voltage on the output thereof to control the frequency of said output clock; and a loop filter integral with said isolation circuit for filtering said control voltage, said isolation circuit with said integral loop filter including a first stage including an operational amplifier responsive to either the source current or the sinked current from said charge pump and a second stage in series therewith including an operational amplifier responsive to the other of the source current or the sinked current from said charge pump, where the control voltage that has a response that is proportional to $1/j\omega C$, where the value of C is a multiple of a physical capacitor of value C' associated with said first stage, wherein the loop filter has an impedance of $R+1/j\omega C$ and the value of C' is multipled by said second stage by a factor of $\beta$.

9. The circuit of claim 8, wherein said charge pump comprises:

a first current source for sourcing current to said intermediate control node; and a second current source for sinking current from said intermediate control node; and said phase detector operable to generate control signals for controlling said first current source to source current to said intermediate control node when said phase error is in one direction and to control said second current source to sink current from said intermediate control node when said phase error is in a second and opposite direction and, when a phase lock condition is present, to neither source current nor sink current to or from said intermediate control node.

10. The circuit of claim 9, wherein said first current source comprises:

a sourcing current source for sourcing a charge pump current, a first primary switch for switching the output of said sourcing current source to said intermediate control node, and a first complimentary switch operable to switch the output of said sourcing current source to a bias node biased with a predetermined voltage when said first primary switch is not operable to connect the output of said sourcing current source to said intermediate control node; and said second current source including:

a sinking current source for sinking a charge pump current, a second primary switch for switching the output of said sinking current source to said intermediate control node, and a second complimentary switch operable to switch the output of said sinking current source to a secondary bias node biased with a predetermined voltage when said second primary switch is not operable to connect the output of said sinking current source to said intermediate control node.

11. The circuit of claim 10, wherein said isolation circuit in said first stage includes as said operational amplifier an amplifier having a differential input with said intermediate control node connected to one input thereof and a reference voltage connected to the other input thereof.

12. The circuit of claim 9, wherein said intermediate control node is comprised of two separate nodes, a first intermediate control node and a second intermediate control node and wherein:

said first current source comprises:
a sourcing current source for sourcing a charge pump current,
a first primary switch for connecting the output of said sourcing current source to said first intermediate control node,
a first complimentary switch for connecting the output of said sourcing current source to said second intermediate control node, and
a first dead time switch for connecting the output of said sourcing current source to a bias node that is connected to a bias voltage;

said second current source comprising:
a sinking current source for sourcing a charge pump current,
a second primary switch for connecting the output of said sinking current source to said first intermediate control node,
a second complimentary switch for connecting the output of said sinking current source to said second intermediate control node, and
a second dead time switch for connecting the output of said sinking current source to the bias node that is connected to the bias voltage;

said phase detector operable, when said phase error is in said one direction, to source current from said sourcing current source through said first primary switch to said first intermediate control node and sink current through said sinking current source from said second complimentary switch and, when said phase error is in said second and opposite direction, to source current from said sourcing current source to said second intermediate control node through said first complimentary switch and to sink current to said sinking current source through said second primary switch from said first intermediate control node and, when a phase lock condition is present, to source current through said first dead time switch from said sourcing current source to said bias node and sink current from said bias node to said sinking current source through said second dead time switch.

13. The circuit of claim 12, wherein said isolation circuit comprises:

as said first stage, an integrator for integrating the current on said first intermediate control node through a first filter capacitor, comprised of physical capacitor C', to provide on an output thereof the integrated voltage of the charge pump current, icp, divided by the capacitance term $j\omega C'$ as an integrated voltage, wherein the input to integrator is disposed at a virtual AC ground;

a high frequency stabilizing portion as said second stage that stabilizes the high frequency portion of the loop response, such that the capacitance C' and the high frequency stabilizing portion provide the loop filter function integrated with said isolation circuit and wherein said secondary intermediate control node is connected to virtual AC ground.

14. The circuit of claim 13, wherein:

said integrator is comprised of:

a first amplifier as said operational amplifier in said first stage having a negative input and a positive input, said negative input connected to said first intermediate control node and said positive input thereof connected to a bias voltage to provide an AC virtual ground at said negative input, said capacitor C' connected between said negative input of said amplifier and said output of said amplifier with said output providing the voltage icp/C', and a first resistor, R1, connected between the output of said first amplifier and said second intermediate control node;

said high frequency stabilizing section comprising:

a second amplifier as said operational amplifier in said second stage having a positive input and a negative input, the negative input thereof connected to said second intermediate control node and the positive input thereof connected to a bias voltage, and a feedback resistor, R2, connected between said negative input and said output of said second amplifier such that the gain thereof is R2/R1, $R_2$ being the "R" portion of the impedance of said loop filter the output of said second amplifier comprising the output control voltage.

* * * * *